US010707859B2

(12) United States Patent
Mauersberger et al.

(10) Patent No.: US 10,707,859 B2
(45) Date of Patent: Jul. 7, 2020

(54) CONTROL DEVICE FOR CONTROLLING A POWER SEMICONDUCTOR COMPONENT AND METHOD FOR CONTROLLING A POWER SEMICONDUCTOR COMPONENT

(71) Applicant: Siemens Aktiengesellschaft, München (DE)

(72) Inventors: Markus Mauersberger, Nürnberg (DE); Rainer Sommer, Heroldsbach (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 16/480,245

(22) PCT Filed: Jan. 25, 2018

(86) PCT No.: PCT/EP2018/051859
§ 371 (c)(1),
(2) Date: Jul. 23, 2019

(87) PCT Pub. No.: WO2018/149612
PCT Pub. Date: Aug. 23, 2018

(65) Prior Publication Data
US 2019/0379371 A1    Dec. 12, 2019

(30) Foreign Application Priority Data

Feb. 14, 2017   (EP) .................................... 17156008

(51) Int. Cl.
*H03K 17/12*   (2006.01)
*H03K 17/10*   (2006.01)

(52) U.S. Cl.
CPC ......... *H03K 17/127* (2013.01); *H03K 17/107* (2013.01); *H03K 2217/0027* (2013.01)

(58) Field of Classification Search
CPC ............... H03K 17/127; H03K 17/107; H03K 2217/0027
See application file for complete search history.

(56) References Cited

U.S. PATENT DOCUMENTS

| 2004/0056646 A1 | 3/2004 | Thalheim |
| 2014/0145779 A1 | 5/2014 | Gediga |
| (Continued) | | |

FOREIGN PATENT DOCUMENTS

| DE | 10 2011 006 788 A1 | 10/2012 |
| DE | 10 2014 224 168 A1 | 6/2016 |
| (Continued) | | |

OTHER PUBLICATIONS

PCT International Search Report and Written Opinion of International Searching Authority dated May 22, 2019 corresponding to PCT International Application No. PCT/EP2018/051859 filed Jan. 25, 2018.

*Primary Examiner* — Carlos Amaya
(74) *Attorney, Agent, or Firm* — Henry M. Feiereisen LLC

(57) ABSTRACT

A control device for controlling a power semiconductor component which includes at least two voltage-controlled power semiconductor devices which are electrically connected in parallel and which have each a control connection is disclosed. The control device includes a driver element which can be used to set electrical voltages at the control connections of the power semiconductor devices. The control device includes a measuring unit configured to capture electrical currents which flow through the power semiconductor devices. The driver element is configured to set a level and/or a temporal profile of the electrical voltages on the basis of the electrical currents.

16 Claims, 4 Drawing Sheets

(56) References Cited

U.S. PATENT DOCUMENTS

2015/0022245 A1    1/2015   Gao et al.
2015/0085539 A1*   3/2015   Ueda .................... H02M 1/38
                                                       363/56.01
2017/0331469 A1   11/2017   Kilb et al.

FOREIGN PATENT DOCUMENTS

EP         2 830 219 A1      1/2015
RU           148939 U1      12/2014
RU          2576578 C2       3/2016
WO      WO 02-052726 A1      7/2002

* cited by examiner

CONTROL DEVICE FOR CONTROLLING A POWER SEMICONDUCTOR COMPONENT AND METHOD FOR CONTROLLING A POWER SEMICONDUCTOR COMPONENT

CROSS-REFERENCES TO RELATED APPLICATIONS

This application is the U.S. National Stage of international Application No. PCT/EP2018/051859, flied Jan. 25, 2018, which designated the United States and has been published as International Publication No. WO 20181149612 A1 and which claims the priority of European Patent Application, Serial No. 17156008.9, filed Feb. 14, 2017, pursuant to 35 U.S.C. 119(a)-(d).

BACKGROUND OF THE INVENTION

The present invention relates to a control device for controlling a power semiconductor component, wherein the power semiconductor component has at least two voltage-controlled power semiconductor component parts, which are electrically connected in parallel and each have a control connection. The control device comprises at least one driver element which can be used to set respective electrical voltages at the control connections of the power semiconductor component parts. Furthermore, the present invention relates to a power semiconductor component with a control device of this type. Finally, the present invention relates to a method for controlling a power semiconductor component.

Interest is aimed predominantly at power semiconductor components, which can be embodied as converters or as power converters, for instance. Power semiconductor components of this type can be used to operate three-phase machines, for instance. The power semiconductor components can have voltage-controlled power semiconductor component parts which are embodied as an IGBT or MOSFET for instance. To increase the performance of a power semiconductor component, it is known from the prior art to use a plurality of power semiconductor component parts in the power semiconductor component and to connect these in parallel. In order to use the power semiconductor component parts to maximum capacity and at the same time not to overload any of the power semiconductor component parts connected in parallel, it is necessary for the electric current, which flows through the respective power semiconductor component parts during a conducting phase, to be distributed uniformly or achieve balance between the power semiconductor component parts.

Different methods are also known from the prior art, in order to achieve balance of the power semiconductor component parts connected in parallel. For instance, different impedances can be used for balancing purposes. Similarly, what is known as derating of the power semiconductor component parts connected in parallel is known. Moreover, it is necessary to pay attention to as symmetrical a design of the control device or control circuit and supply lines as possible. Depending on the type of power semiconductor component part, it is also necessary to pay attention to a good thermal coupling or decoupling.

Furthermore, it is known from the prior art to provide a temporal displacement of the individual switching pulses of the power semiconductor component parts connected in parallel with respect to one another. This means in particular that one or more of the power semiconductor component parts is/are switched on earlier than the others in the group and thus draw more electric current. The same provisions apply accordingly to the switch-off process of the power semiconductor component parts.

To this end DE 10 2011 006 788 A1 describes a circuit arrangement for a protective device in a system, with electrical energy sources which have variable current and/or voltage parameters. The circuit arrangement consists of at least two fuse channels which are connected in parallel and which each comprise a current measuring device and at least one switch. The fuse channels have defined resistance values of this type, such that a total current is distributed symmetrically between the fuse channels.

It is the object of the present invention to present a solution as to how a power semiconductor component having at least two power semiconductor component parts connected in parallel can be operated easily and more reliably.

SUMMARY OF THE INVENTION

This object is achieved according to the invention by a control device, by a power semiconductor component and by a method having the features according to the respective independent claims. Advantageous developments of the present invention are the subject matter of the dependent claims.

An inventive control device is used to control a power semiconductor component. In this regard the power semiconductor component has at least two voltage-controlled power semiconductor component parts, which are electrically connected in parallel and which each have a control connection. The control device comprises at least one driver element, by means of which respective electrical voltages can be set at the control connections of the power semiconductor component parts. Furthermore, the control device has a measuring unit, which is designed to detect respective electric currents flowing through the power semiconductor component parts. Furthermore, the at least one driver element is designed to set a degree and/or a time curve of the respective electrical voltages as a function of the respective electric currents. Furthermore, the at least one driver element is designed to set a temporal change in the respective electrical voltages applied to the control connections when the power semiconductor component parts are switched on and/or switched off as a function of the respective electric currents.

The control device can be used for a power semiconductor component, which is used in a power converter or converter, for instance. Power semiconductor components can be controlled with the control device, which has at least two power semiconductor component parts which are electrically connected in parallel. The power semiconductor component parts each have a control connection, to which an electrical voltage can be applied. This control connection can also be referred to as a gate or gate connection. The power semiconductor component parts can be embodied in particular as an IGBT, as a JFET or as a MOSFET. These power semiconductor component parts are used within the power semiconductor component as controllable switches. The control device has at least one driver element, which is electrically connected to each of the control connections of the power semiconductor component parts. The driver element can also be referred to as a driver or as a gate unit. The driver element can be used to output an electrical voltage and to apply the same to the respective control connections of the power semiconductor component parts.

According to an essential aspect of the present invention, provision is now made for the control device to have a measuring unit, by means of which the respective electric currents, which flow through the power semiconductor component parts, can be detected. For instance, the measuring unit for each power semiconductor component part can have a current sensor. A shunt or resistor can also be provided, on which the voltage drop is measured in order to determine the electric current. The electric current which flows through the respective power semiconductor component part during the conducting phase can therefore be detected. The at least one driver element is designed to adjust the respective electrical voltages, which are applied to the control connections of the power semiconductor component parts, as a function of the respective currents which flow through the power semiconductor component parts.

In doing so, on the one hand, the amount of electrical voltage can be adjusted with the driver element. Voltages of differing amounts or differing electrical voltages can be output variably with the aid of the driver element. The electrical voltage can thus be selected relatively freely. In particular, there is no provision for the electrical voltage not to be set only for two or three fixed values. Alternatively or in addition, the driver element can control the time curve of the voltage. In this way, the electrical voltage can be adjusted to the respective power semiconductor component part as a function of the current which currently flows through the power semiconductor component part. It is therefore possible, for instance, for the respective currents, which flow through the power semiconductor component parts of the power semiconductor component, to be essentially the same. This allows for a balance to be achieved between the currents which flow through the power semiconductor component parts. In this way, an overload of the power semiconductor component parts can be avoided. Overall, a reliable operation of the power semiconductor component is thus enabled.

Moreover, the driver device is designed to set a temporal change in the respective electrical voltages applied to the control terminals as a function of the respective electric currents. Provision is made here for the temporal change in the respective electrical voltages to be set when being switched on and/or switched off. A dynamic parallelization can therefore be achieved when being switched on and/or switched off. For the course of the electrical voltage, different time curves can therefore be predetermined. One power semiconductor component part can therefore be switched on more quickly than the other. This is also applicable for switching off the power semiconductor component parts. This can be achieved, for instance, by the slope of the edges of the electrical voltage being adjusted. This is preferably suited to compensating for different stray inductances. With respect to the respective electrical voltage, which is present at the control connections, the amount of electrical voltage and/or the time curve and/or the start time and/or the end time can be adjusted.

The at least one driver element is preferably designed to set the respective electrical voltages such that the respective electric currents are essentially the same. By means of the voltage which is applied to the control connection of the power semiconductor component part, the electrical resistance of the power semiconductor component part can be controlled. In this process a relatively high voltage at the control connection provides for a low electrical resistance. A relatively low electrical voltage provides for a high electrical resistance. In this way the electric current, which flows through the respective power semiconductor component part, can be influenced accordingly. In this way, an overload of or damage to the respective power semiconductor component parts can be prevented.

According to one embodiment, the at least one driver element is designed to set respective start times and end time, between which the electrical voltage is applied to the control connections, as a function of the respective electric currents. In other words, the individual switching pulses of the power semiconductor component parts connected in parallel can be displaced relative to one another. The electrical voltage can thus be applied to one or more of the power semiconductor component parts earlier than to the other power semiconductor parts. The same applies to the end time, after which the electrical voltage is no longer applied to the respective control connections. The current distribution within the power semiconductor component parts can be controlled in this way.

Furthermore, it is advantageous if the at least one driver element is designed to set the respective electrical voltages on the basis of voltages set during a preceding operation of the power module. The respective voltages, which are applied to the power semiconductor component parts during operation of the power semiconductor component, can be stored in a corresponding storage device of the control device. This thus enables the specific switching properties, in other words the voltage curve, the voltage change, the voltage amount and/or the switching times, to be determined on the basis of the preceding settings. Furthermore, the electric currents which flow through the power semiconductor component parts with specific settings with respect to the voltage can be stored. A learnable system can therefore be provided.

In one embodiment, the control device has a driver element, which has an output and at least one input for receiving measured values, which describe the respective electric currents, for each of the power semiconductor component parts. According to this embodiment, the control device has a single driver element. In this regard, each output of the driver element is connected to a control connection of a power semiconductor component. In addition, the driver element can receive the measured values from the measuring device, said measured values describing the respective electric currents through the power semiconductor component parts. The measured values can then be compared with one another using the driver element, and the electrical voltages are thus determined for the respective power semiconductor component parts.

According to an alternative embodiment, the control device has one driver element for each of the power semiconductor component parts, wherein each of the driver elements has an output for the power semiconductor component part. In this embodiment, a separate driver element is assigned to each of the power semiconductor component parts. Each driver element can provide the voltage for the power semiconductor component at the output. Moreover, each driver element has an input, in order to receive the measured value, which describes the electric current through the power semiconductor component part. In this case provision is made in particular for the control device to have at least one communication unit for transmitting the respective measured values between the driver elements. For instance, the respective driver elements can be connected by means of the communication unit for data transmission purposes. In this case the data transmission can take place by way of a cable or a data line, optically or by way of a radio link.

In this regard, there may be provision for the respective currents, which flow through the power semiconductor component parts, to be compared with a threshold value. If this threshold value is exceeded, the respective driver elements can match with one another and the respective voltages, which are output with the respective driver element, can be adjusted such that the current distribution between the power semiconductor component parts is equal again.

According to a further embodiment, the control device has a central computing unit for receiving measured values, which describe the respective electric currents, and at least one communication unit for transmitting the respective measured values to the driver elements. There may therefore also be provision for a superordinate or central computing unit, by means of which the respective measured values can be received. These values can then be transmitted to the respective driver elements by way of the communication unit, as described previously.

Basically, the voltage for the power semiconductor component part can be determined with the at least one driver element as a function of the current through the power semiconductor component part. If the current through the power semiconductor component part is too high, the voltage can be reduced. If the current through the power semiconductor component part is too low, the voltage can be increased. Characteristic curves or tables which describe the voltage to be output as a function of the current can be stored in the driver element.

As described previously, the control device can be used to control power semiconductor component parts connected in parallel. These power semiconductor component parts can also be referred to as chips. Moreover, the control device can be used to control parallel-connected power semiconductor modules or converters. Individual chips are often connected in parallel in power modules and guided outward so that the individual power semiconductor module in turn has the same interfaces as a power semiconductor component part. For instance, the power semiconductor module can have a gate connection, a collector connection and/or an emitter connection just like an individual power semiconductor. The converter consists, in turn, of individual power semiconductors and/or power semiconductor modules as well as additional components, such as for instance capacitors, power supplies and such like.

An inventive power semiconductor component comprises at least two voltage-controlled power semiconductor component parts and an inventive control device for controlling the at least two voltage-controlled power semiconductor component parts. There is preferably provision here for the power semiconductor component to be part of a power converter or converter. The at least two power semiconductor component parts are preferably embodied as an IGBT, as a JEFT or as a MOSFET.

An inventive method serves to control a power semiconductor component, wherein the power semiconductor component has at least two voltage-controlled power semiconductor components, which are electrically connected in parallel and each have a control connection. In the method, respective electrical voltages are set at the control connections of the power semiconductor component parts using at least one driver element. Furthermore, there is provision for respective electric currents, which flow through the power semiconductor component part, to be detected by means of a measuring unit and an amount and/or a time curve of the respective electrical voltages to be set by means of the at least one driver element as a function of the respective electric currents. In addition, there is provision for the at least one driver element to set a temporal change in the respective electrical voltages applied to the control connections when the power semiconductor component parts are switched on and/or switched off as a function of the respective electric currents.

The preferred embodiments presented in respect of the inventive control device and the advantages thereof apply correspondingly to the inventive power semiconductor component and the inventive method.

BRIEF DESCRIPTION OF THE DRAWING

The invention is now explained in more detail on the basis of preferred exemplary embodiments and with reference to the appended drawings, in which.

In the figures, similar and functionally similar elements are provided with the same reference signs.

DETAILED DESCRIPTION OF PREFERRED EMBODIMENTS

Figure 1:
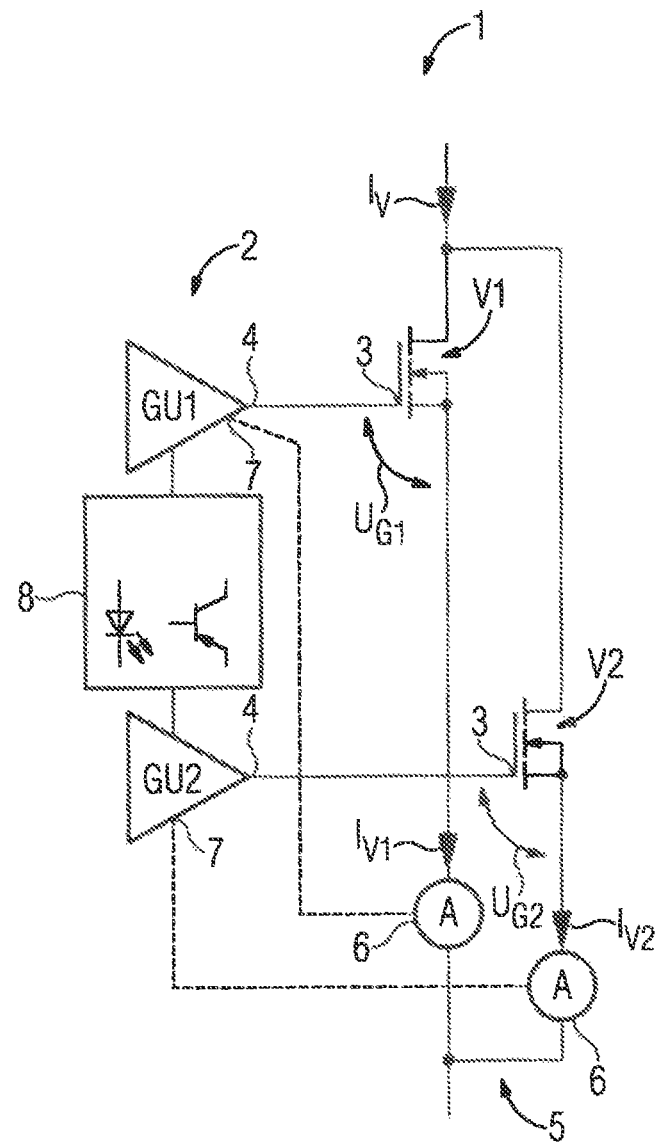
FIG. 1 shows a power semiconductor component according to an embodiment of the invention, which has two voltage-controlled power semiconductor component parts and a control device.

FIG. 1 shows a power semiconductor component 1 according to an embodiment of the present invention in a schematic representation. The power semiconductor component 1 can be part of a power converter or a converter. The power semiconductor component 1 comprises a first power semiconductor component part V1 and a second power semiconductor component part V2. The power semiconductor component parts V1, V2 are embodied as MOSFETs. The power semiconductor component parts V1, V2 are electrically connected in parallel. An overall current $I_V$ is currently divided between the two power semiconductor component parts V1, V2. A current $I_{V1}$ thus flows through the first power semiconductor component part V1 and a current $I_{V2}$ flows through the second power semiconductor component part V2. During operation of the power semiconductor component 1, attempts are made to ensure that the electric currents $I_{V1}$ and $I_{V2}$ are essentially the same.

Furthermore, the power semiconductor component 1 comprises a control device 2 for controlling the power semiconductor component parts V1, V2. The control device 2 comprises at least one driver element GU1, GU2, with which a respective electrical voltage $U_{G1}$, $U_{G2}$ can be applied to respective control connections 3 of the power semiconductor component parts V1, V2. The control connections 3 correspond to the gate connections of the MOSFETs. In the present example, a driver element GU1, GU2 is assigned to each of the power semiconductor component parts V1, V2. In this case a first driver element GU1 is assigned to the first power semiconductor component part V1, wherein an output 4 of the first driver element GU1 is connected to the control connection 3 of the first power semiconductor component part V1. The electrical voltage $U_{G1}$ can thus be applied to the control connection 3 of the first power semiconductor component V1. In the same way, an electrical voltage $U_{G2}$ can be applied to the control connection 3 of the second power semiconductor component V2 with the second driver element GU2.

Furthermore, the control device 2 comprises a measuring unit 5, by means of which the respective currents $I_{V1}$, $I_{V2}$ through the power semiconductor component parts V1, V2 can be determined. The measuring unit 5 currently comprises two current sensors 6, wherein in each case a current sensor 6 is assigned to a power semiconductor component part V1, V2. The respective current sensors 6 are connected to respective inputs 7 of the driver elements GU1, GU2. Each measured value which describe the electric currents $IV_1$, $IV_2$ can thus be received by the driver elements GU1, GU2.

Furthermore, the control device 2 comprises a communication unit 8, by means of which the driver elements GU1, GU2 are connected for data transmission purposes. This thus enables measured values to be exchanged between the driver elements GU1, and GU2. As a function of the measured values or the currents $I_{V1}$ and $I_{V2}$ through the power semiconductor component parts V1, V2, the electrical voltages $U_{G1}$ and $U_{G2}$, which are output with the driver elements GU1, UG2, can then be adjusted.

Figure 2:
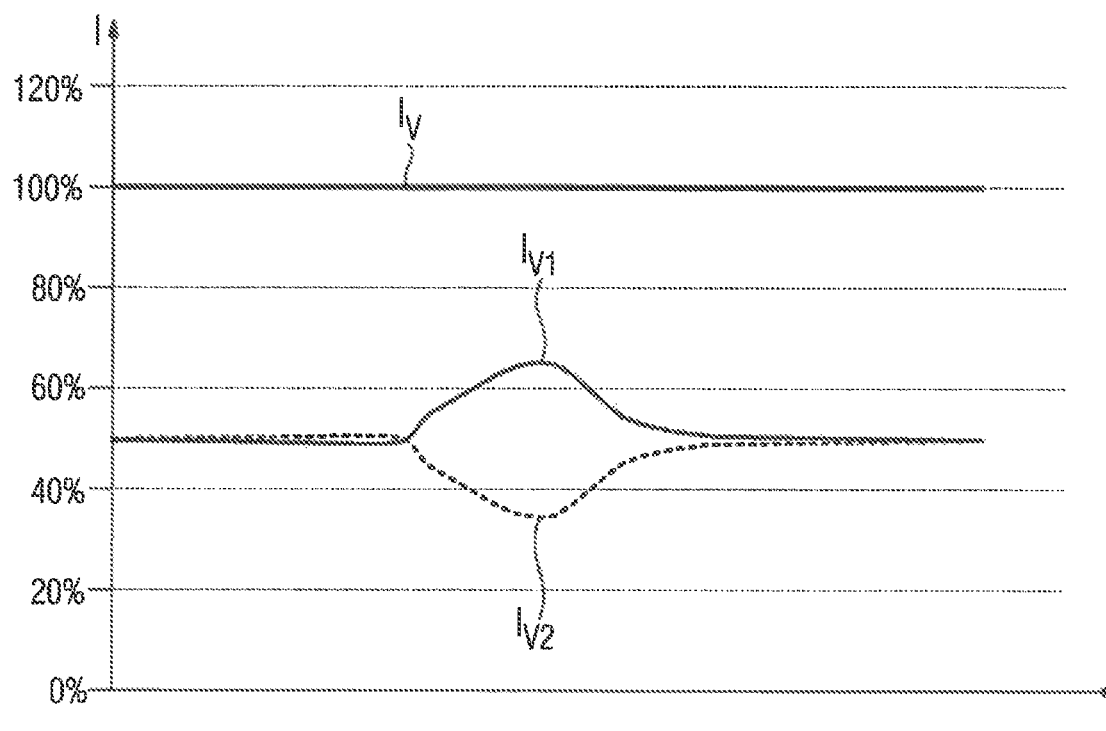
FIG. 2 shows a time curve of the respective currents, which flow through the power semiconductor component parts.

FIG. 2 shows the respective electric currents $I_{V1}$ and $I_{V2}$ through the power semiconductor component parts V1 and V2 as a function of the time t. The diagram in FIG. 2 shows the electric current I as a function of the time t. In this regard, it should be mentioned here that the electric current $I_{V1}$ through the first power semiconductor component part V1 increases as a function of the time t and the electric current $I_{V2}$ through the second power semiconductor component part V2 reduces as a function of the time t. The changes to the electric currents $I_{V1}$ and $I_{V2}$ can be substantiated by external influences, such as heating, and by parameter fluctuations in the individual power semiconductor components V1, V2.

Figure 3:
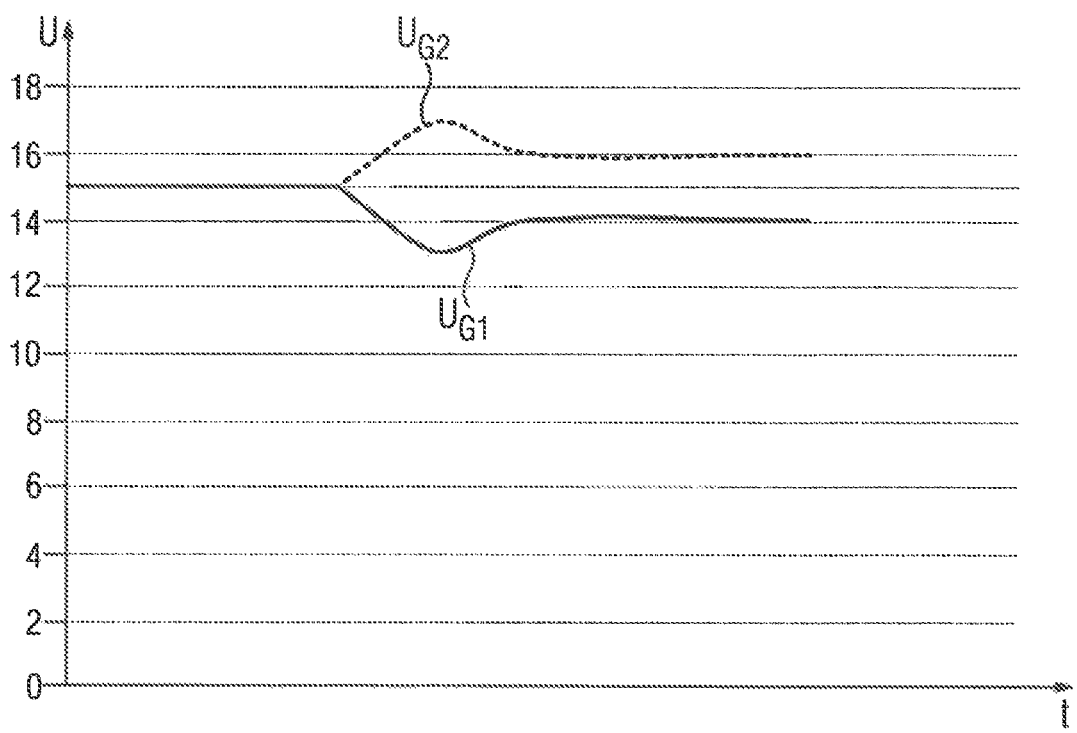
FIG. 3 shows respective electrical voltages, which are applied to control connections of the power semiconductor component parts as a function of the currents.

This change in the division of the electric currents $I_{V1}$, $I_{V2}$ through the power semiconductor component parts V1, V2 can be detected with the aid of the driver elements GU1, GU2 on the basis of the measured value. As a function of the respective electric currents $I_{V1}$, $I_{V2}$, the electrical voltages $U_{G1}$ and $U_{G2}$, which are output by the driver elements GU1, GU2, are adjusted. This is shown in FIG. 3. At present the electrical voltage $U_{G2}$ at the second power semiconductor component part V2 is increased as a function of the time t. The electrical resistance within the second power semiconductor component part V2 can thus be reduced. The electrical voltage $U_{G1}$ at the first power semiconductor component V1 is reduced in the same way. The electrical resistance within the first power semiconductor component part V1 can thus be increased. Overall, it is therefore possible, for instance, for the currents, $I_{V1}$, $I_{V2}$, which flow through the power semiconductor component parts V1 and V2 to be essentially the same.

Figure 4:
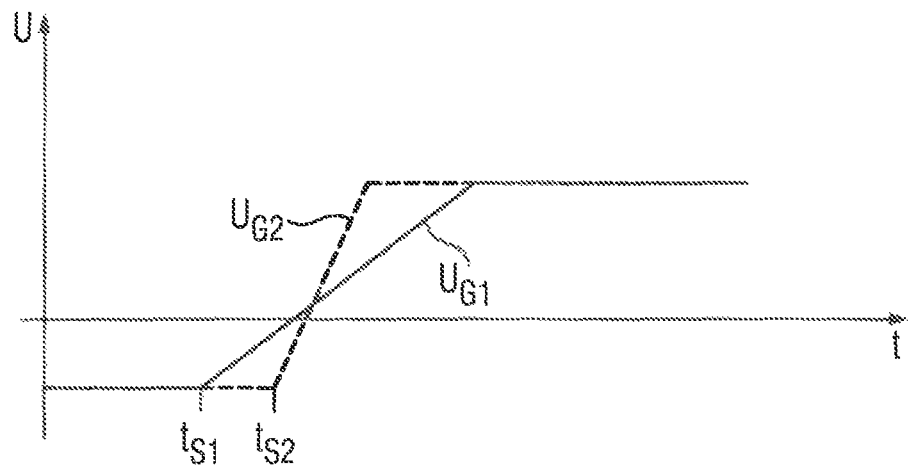
FIG. 4 shows respective electrical voltages, which are applied to control connections of the power semiconductor component parts as a function of the currents in accordance with a further embodiment.

FIG. 4 shows the curve of the electrical voltages $U_{G1}$ and $U_{G2}$ according to a further embodiment. Here the voltages $U_{G1}$ and $U_{G2}$ differ with respect to the start times $t_{s1}$ and $t_{s2}$, from which these are applied to the control connections 3. At present the electrical voltage $U_{G1}$ is firstly applied to the control connection 3 at the start time $t_{s1}$. The electrical voltage $U_{G2}$ is then applied to the control connection 3 at the start time $t_{s2}$. End times, from which the respective electrical voltages $U_{G1}$ and $U_{G2}$ are no longer applied to the control connections 3, can be adjusted similarly. Moreover, the electrical voltages $U_{G1}$ and $U_{G2}$ differ with respect to their temporal changes when switching-on or applying voltage. At present the electrical voltages $U_{G1}$ and $U_{G2}$ have straight edges with a different slope when switched on. The second power semiconductor component part V2, to which the voltage $U_{G2}$ is applied, is currently switched on more quickly than the first power semiconductor component part V1, to which the voltage $U_{G1}$ is applied. The second power semiconductor component part V2 thus draws dynamically more current than the first power semiconductor component part V1.

Figure 5:
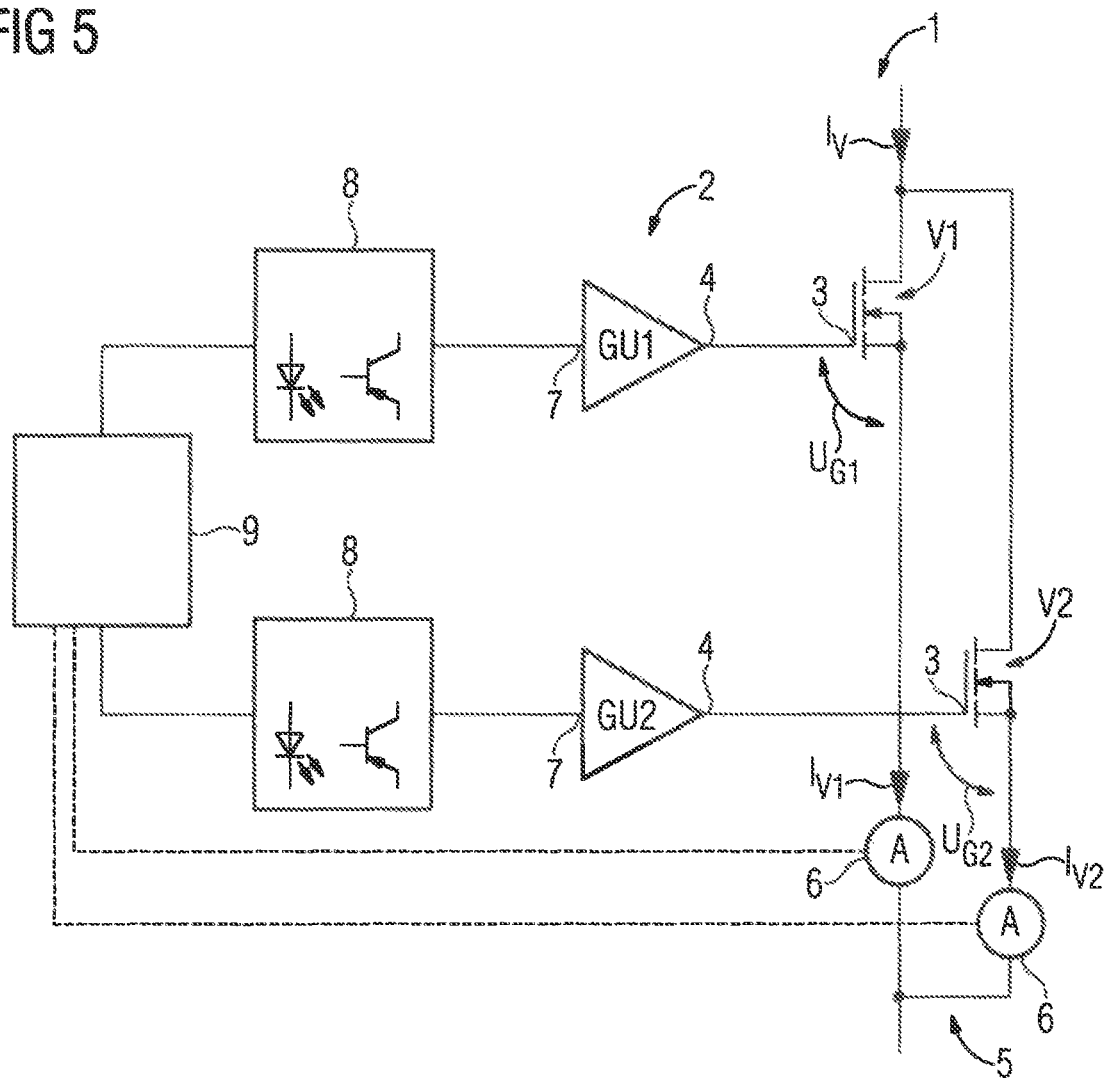
FIG. 5 shows a power semiconductor component according to a further embodiment.

FIG. 5 shows a power semiconductor component 1 according to a further embodiment. In this case, the control device 2 comprises additionally a central computing unit 9. This central computing unit 9 is connected to the respective current sensors 6 for data transmission purposes. The computing unit 9 can thus receive the measured values provided with the current sensors 6. These measured values can be transmitted to the driver elements GU1, GU2 by way of corresponding communication units 8.

Figure 6:
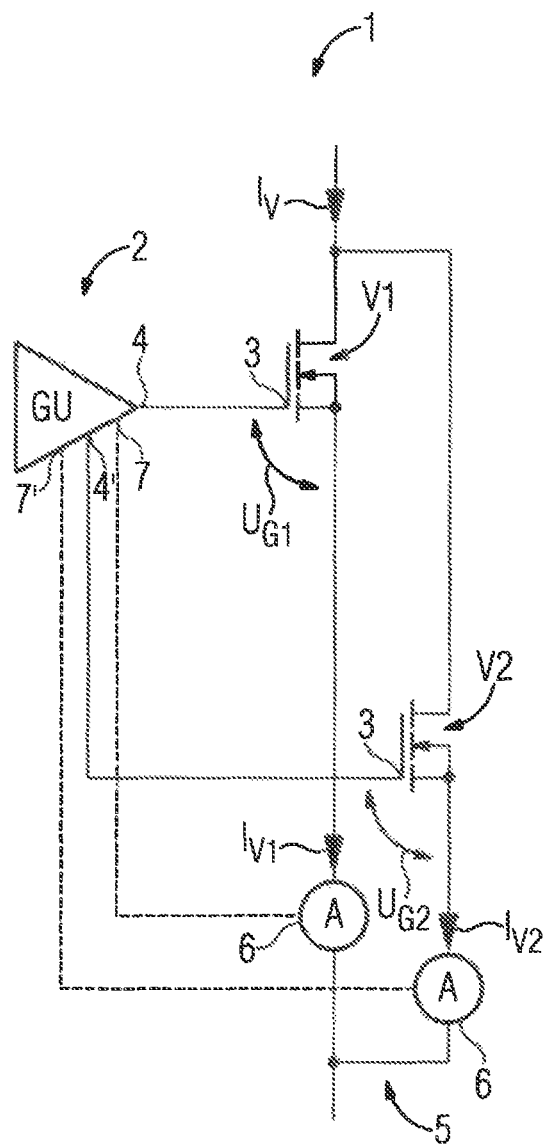
FIG. 6 shows a power semiconductor component according to a further embodiment.

FIG. 6 shows the power semiconductor component 1 according to a further embodiment. In this case, the control device 2 has a single driver element GU. The driver element GU presently has a first output 4, which is connected to the first power semiconductor component part V1, and a second output 4', which is connected to the second power semiconductor component part V2. Furthermore, the driver element GU has respective inputs 7 and 7' which are connected to the respective current sensors 6.

Basically there can be provision for the power semiconductor component 1 to have a plurality of power semiconductor component parts V1, V2, which are connected in parallel. With the respective driver elements GU, GU1, GU2, the amount and/or the time curve of the respective electrical voltages $U_{G1}$, $U_{G2}$ can be adjusted as a function of the currents $I_{V1}$, $I_{V2}$. Different through properties of the power semiconductor component parts V1, V2 can be compensated by adjusting the amount of voltage. Provision can also be made here for the switch-on pulses ts1, ts2 and/or the switch-off pulses to be displaced temporally in order to apply the respective electrical voltages $U_{G1}$, $U_{G2}$ to the power semiconductor component part V1, V2. Moreover, the time change in the electrical voltages $U_{G1}$, $U_{G2}$ can be adjusted as a function of the currents $I_{V1}$, $I_{V2}$. In this way, different stray inductances can be compensated. Furthermore, the method can be applied so that the specific switching properties, in other words the voltage curve, the amount of voltage and/or the switching times, can be obtained from current information of previous pulses. A learnable system can therefore be provided.

What is claimed is:

1. A control device for controlling a power semiconductor component having at least two voltage-controlled power semiconductor component parts which are electrically connected in parallel and which each have a control connection, said control device comprising:
   a measuring unit configured to detect electric currents flowing through the power semiconductor component parts; and
   a driver element configured to
      set electrical voltages at the control connections of the power semiconductor component parts,
      to set an amount and/or a time curve of the electrical voltages as a function of the electric currents,
      to set a temporal change in the electrical voltages applied at the control connections by adjusting a slope of straight edges of the electrical voltages when the power semiconductor component parts are switched on and/or switched off as a function of the electric currents,
to set the electrical voltages on the basis of voltages set during a preceding operation of the power semiconductor component, wherein the electrical currents, which flow through the power semiconductor component parts with specific settings with respect to the electrical voltages, are stored, and
to determine the temporal change in the electrical voltages on the basis of the preceding settings.

2. The control device of claim 1, wherein the driver element is configured to set the electrical voltages such that the electric currents are essentially the same.

3. The control device of claim 1, wherein the driver element is configured to set start times and an end time, between which the electrical voltages are applied to the control connections, as a function of the electric currents.

4. The control device of claim 1, wherein the driver element includes an output and an input for each of the power semiconductor component parts for receiving measured values which describe the electric currents.

5. The control device of claim 1, further comprising a further said driver element, with the driver elements operably connected to the power semiconductor component parts in one-to-one correspondence, with the driver elements having each an output connected to the power semiconductor component parts, respectively.

6. The control device of claim 5, wherein the driver elements have each an input for receiving measured values which describe the electric currents through the power semiconductor component parts, and further comprising a communication unit configured to transmit the measured values between the driver elements.

7. The control device of claim 5, further comprising:
a central computing unit configured to receive measured values which describe the electric currents; and
a communication unit configured to transmit the measured values to the driver elements.

8. A power semiconductor component, comprising:
at least two voltage-controlled power semiconductor component parts which are electrically connected in parallel and which each have a control connection; and
a control device for controlling the at least two voltage-controlled power semiconductor component parts, said control device comprising a measuring unit configured to detect electric currents flowing through the power semiconductor component parts, and a driver element configured to set electrical voltages at the control connections of the power semiconductor component parts, to set an amount and/or a time curve of the electrical voltages as a function of the electric currents, to set a temporal change in the electrical voltages applied at the control connections by adjusting a slope of straight edges of the electrical voltages when the power semiconductor component parts are switched on and/or switched off as a function of the electric currents, to set the electrical voltages on the basis of voltages set during a preceding operation of the power semiconductor component, wherein the electrical currents, which flow through the power semiconductor component parts with specific settings with respect to the electrical voltages, are stored, and to determine the temporal change in the electrical voltages on the basis of the preceding settings.

9. The power semiconductor component of claim 8, wherein the at least two power semiconductor component parts are embodied as an IGBT or as a MOS FET.

10. The power semiconductor component of claim 8, wherein the driver element is configured to set the electrical voltages such that the electric currents are essentially the same.

11. The power semiconductor component of claim 8, wherein the driver element is configured to set start times and an end time, between which the electrical voltages are applied to the control connections, as a function of the electric currents.

12. The power semiconductor component of claim 8, wherein the driver element includes an output and an input for each of the power semiconductor component parts for receiving measured values which describe the electric currents.

13. The power semiconductor component of claim 8, wherein the control device comprises a further said driver element, with the driver elements operably connected to the power semiconductor component parts in one-to-one correspondence, with the driver elements having each an output for the power semiconductor component parts, respectively.

14. The power semiconductor component of claim 13, wherein the driver elements have each an input for receiving measured values which describe the electric currents through the power semiconductor component parts, said control device comprising a communication unit configured to transmit the measured values between the driver elements.

15. The power semiconductor component of claim 13, wherein the control device comprises a central computing unit configured to receive measured values which describe the electric currents, and a communication unit configured to transmit the measured values to the driver elements.

16. A method for controlling a power semiconductor component having at least two voltage-controlled power semiconductor component parts which are electrically connected in parallel and which each have a control connection, said method comprising:
setting with a driver element electrical voltages at the control connections of the power semiconductor component parts;
detecting by a measuring unit electric currents flowing through the respective power semiconductor component parts;
setting by the driver element an amount and/or a time curve of the electrical voltages as a function of the electric currents;
setting by the driver element a temporal change in the electrical voltages applied to the control connections by adjusting a slope of straight edges of the electrical voltages when the power semiconductor component parts are switched on and/or switched off as a function of the electric currents;
setting by the driver element the electrical voltages on the basis of voltages set during a preceding operation of the power module;
storing the electrical currents, which flow through the power semiconductor component parts with specific settings with respect to the electrical voltages; and
determining the temporal change in the electrical voltages on the basis of the preceding settings.

* * * * *